United States Patent
Mifsud et al.

(10) Patent No.: US 10,090,125 B2
(45) Date of Patent: Oct. 2, 2018

(54) METHODS OF DETERMINING THE ORDER OF OPERATING CONTACTORS IN HIGH VOLTAGE CIRCUITS

(71) Applicant: GM GLOBAL TECHNOLOGY OPERATIONS LLC, Detroit, MI (US)

(72) Inventors: David J. Mifsud, Novi, MI (US); Sara Safaeian, Commerce Township, MI (US); Daniel P. Grenn, Highland, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 338 days.

(21) Appl. No.: 15/139,719

(22) Filed: Apr. 27, 2016

(65) Prior Publication Data
US 2017/0316905 A1    Nov. 2, 2017

(51) Int. Cl.
| | |
|---|---|
| H01H 47/22 | (2006.01) |
| H01H 50/54 | (2006.01) |
| H02J 7/00 | (2006.01) |
| G01R 31/327 | (2006.01) |
| H01H 33/00 | (2006.01) |

(52) U.S. Cl.
CPC ............ *H01H 47/22* (2013.01); *H01H 50/54* (2013.01); *G01R 31/327* (2013.01); *H01H 33/00* (2013.01); *H02J 7/0031* (2013.01)

(58) Field of Classification Search
CPC ........ H01H 47/22; H01H 50/44; H01H 33/00; G01R 31/327; H02J 7/0031
See application file for complete search history.

(56) References Cited

U.S. PATENT DOCUMENTS

| | | | | |
|---|---|---|---|---|
| 9,720,049 B2* | 8/2017 | Anzicek | ............ | G01R 31/3658 |
| 2010/0250194 A1* | 9/2010 | Newhouse | ............ | B60R 16/023 |
| | | | | 702/183 |
| 2011/0049977 A1* | 3/2011 | Onnerud | ............... | B60L 3/0046 |
| | | | | 307/9.1 |
| 2011/0084704 A1* | 4/2011 | Myoen | ...................... | B60L 3/12 |
| | | | | 324/538 |
| 2013/0127243 A1* | 5/2013 | Berg | ...................... | B60L 3/0053 |
| | | | | 307/9.1 |
| 2013/0278269 A1* | 10/2013 | Steck | .................. | G01R 31/3278 |
| | | | | 324/418 |
| 2014/0097797 A1* | 4/2014 | Hendrix | .............. | H01M 2/1077 |
| | | | | 320/118 |
| 2015/0270081 A1* | 9/2015 | Hartl | ...................... | B60R 16/03 |
| | | | | 361/170 |
| 2016/0025816 A1 | 1/2016 | Anzicek | | |

* cited by examiner

*Primary Examiner* — Scott Bauer
(74) *Attorney, Agent, or Firm* — Quinn IP Law

(57) ABSTRACT

A method of controlling positive and negative contactors in a high voltage electrical system includes sensing current flowing through each contactor prior to opening of the contactor and/or after closing of the contactor. A negative contactor weighted value is computed based at least partially on the sensed current flowing through the negative contactor during opening and/or closing. A positive contactor weighted value is computed based at least partially on the sensed current flowing through the positive contactor during opening and/or closing. The order of opening and/or closing of the contactors is determined utilizing at least one of the negative contactor weighted value and the positive contactor weighted value.

18 Claims, 2 Drawing Sheets

METHODS OF DETERMINING THE ORDER OF OPERATING CONTACTORS IN HIGH VOLTAGE CIRCUITS

TECHNICAL FIELD

The disclosure generally relates to high voltage ("HV") electrical systems and particularly to operating contactors in HV electrical systems in vehicles.

BACKGROUND

Electric and hybrid electric vehicles utilize a high voltage electrical system to drive one or more electric motors and, thus, propel the vehicle. Such systems typically include one or more electrical contactors disposed between a power supply, e.g., a battery, and a load, e.g., the electric motor. Each contactor has a pair of contacts which may "close" to electrically connect the power supply to the load and "open" to electrically disconnect the power supply from the load. Typically, a coil, i.e., an electromagnet, is utilized to close the contactor, as is appreciated by those skilled in the art. When contactors are opened or closed under excessive current, arcing may occur between the contacts, which could cause damage and/or performance issues.

SUMMARY

In one exemplary embodiment, a method of controlling a positive contactor and a negative contactor in a high voltage ("HV") electrical system. The method includes sensing current flowing through each contactor prior to opening of the contactor and/or after closing of the contactor. The method also includes calculating a negative contactor weighted value based at least partially on the sensed current flowing through the negative contactor during at least one opening and/or closing of the negative contactor. The method further includes calculating a positive contactor weighted value based at least partially on the sensed current flowing through the positive contactor during at least one opening and/or closing of the positive contactor. The order of opening and/or closing of the negative contactor and the positive contactor is determined utilizing at least one of the negative contactor weighted value and the positive contactor weighted value. The method further includes operating the contactors based on the determined order and in response to receiving an open command or a close command.

In one exemplary embodiment, an electrical system includes an HV power supply having a positive pole and a negative pole. A positive contactor is electrically connected between the positive pole and a load and a negative contactor is electrically connected between the negative pole and the load. The system includes a positive contactor current sensor configured to sense current flowing through the positive contactor prior to opening and/or after closing of the positive contactor. The system also includes a negative contactor current sensor configured to sense current flowing through the negative contactor prior to opening and/or after closing of the negative contactor. The system further includes at least one controller in communication with the contactors and the current sensors. The controller is configured to calculate a negative contactor weighted value based at least partially on the sensed current flowing through the negative contactor during at least one opening and/or closing of the negative contactor. The controller is also configured to calculate a positive contactor weighted value based at least partially on the sensed current flowing through the positive contactor during at least one opening and/or closing of the positive contactor. The controller is further configured to determine the order of opening and/or closing of the negative contactor and the positive contactor utilizing at least one of the negative contactor weighted value and the positive contactor weighted value. The controller also is configured to operate the contactors based on the determined order and in response to receiving an open command or a close command.

In one exemplary embodiment, a vehicle having an HV electrical system includes an HV power supply with a positive pole and a negative pole. The vehicle also includes an electric motor electrically connectable to the HV power supply. A positive contactor is electrically connected between the positive pole and the electric motor and a negative contactor electrically connected between the negative pole and the electric motor. The HV electrical system also includes a positive contactor current sensor configured to sense current flowing through the positive contactor prior to opening and/or after closing of the positive contactor. The HV electrical system further includes a negative contactor current sensor configured to sense current flowing through the negative contactor prior to opening and/or after closing of the negative contactor. At least one controller is in communication with the contactors and the current sensors. The at least one controller is configured to calculate a negative contactor weighted value based at least partially on the sensed current flowing through the negative contactor during at least one opening and/or closing of the negative contactor. The at least one controller is also configured to calculate a positive contactor weighted value based at least partially on the sensed current flowing through the positive contactor during at least one opening and/or closing of the positive contactor. The at least one controller is further configured to determine the order of opening and/or closing of the negative contactor and the positive contactor utilizing at least one of the negative contactor weighted value and the positive contactor weighted value. The at least one controller is also configured to operate the contactors based on the determined order and in response to receiving an open command or a close command.

The above features and advantages and other features and advantages of the present teachings are readily apparent from the following detailed description of the best modes for carrying out the teachings when taken in connection with the accompanying drawings.

DETAILED DESCRIPTION

Those having ordinary skill in the art will recognize that terms such as "above," "below," "upward," "downward," "top," "bottom," etc., are used descriptively for the figures, and do not represent limitations on the scope of the disclosure, as defined by the appended claims. Furthermore, the teachings may be described herein in terms of functional and/or logical block components and/or various processing steps. It should be realized that such block components may be comprised of any number of hardware, software, and/or firmware components configured to perform the specified functions.

Referring to the Figures, wherein like numerals indicate like parts throughout the several views, an electrical system 100 and method 200 of operating are shown and described herein. The electrical system 100 in the exemplary embodiment is a high voltage ("HV") electrical system configured to operate at voltages greater than 60 volts (V). However, it should be appreciated that the electrical system 100 and associated methods 200 may be configured to operate at lower voltage levels.

Figure 1:
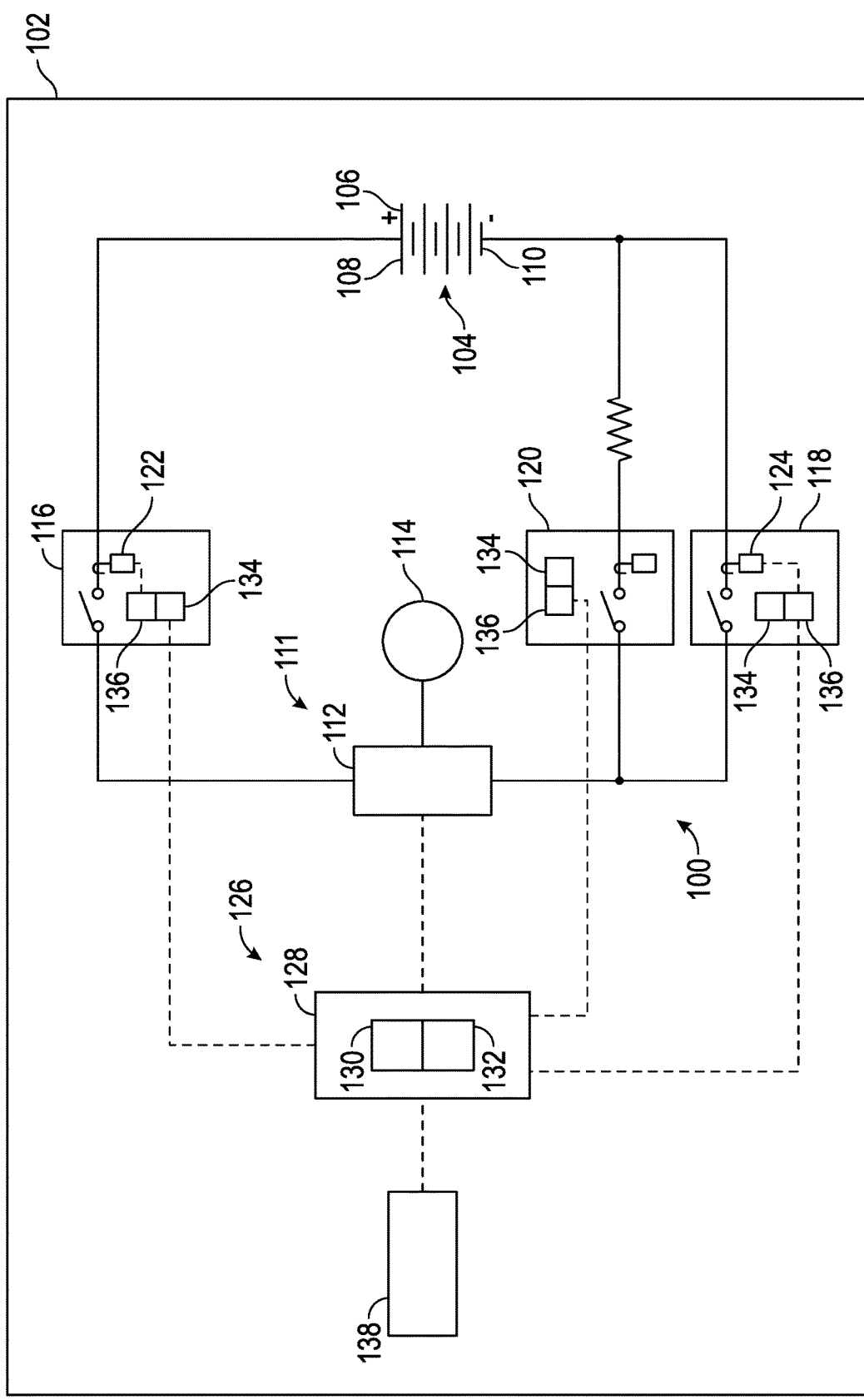
FIG. 1 is a schematic block diagram illustrating an electrical system of a vehicle according to one exemplary embodiment.

The electrical system 100 shown in the exemplary embodiment of FIG. 1 is implemented in a vehicle 102 such as an automobile (not separately numbered). However, it should be appreciated that the electrical system 100 may be implemented in other vehicles 102, including, but not limited to, motorcycles, all-terrain vehicles ("ATVs"), golf carts, aircraft, locomotives, and boats. Furthermore, the electrical system 100 shown and described herein may also be implemented in non-vehicle applications (not shown).

The electrical system 100 includes an HV power supply 104. In the exemplary embodiment, the HV power supply 104 includes a battery 106 having a plurality of cells (not separately numbered). Of course, the HV power supply 104 may be implemented with other devices including, but not limited to, a solar cell (not shown). Furthermore, a plurality of HV power supplies 104 may be implemented. The HV power supply 104 includes a positive pole 108 and a negative pole 110.

The electrical system 100 also includes a load 111 electrically connectable to the HV power supply 104. In the exemplary embodiment, the load 111 includes a traction power inventor module ("TPIM") 112, sometimes referred to simply as a "traction inventor." The load 111 of the exemplary embodiment also includes an electric motor 114 electrically connected to the TPIM 112. The electric motor 114 may be coupled to an axle (not shown) and/or wheels (not shown) for propelling the vehicle 102 as is appreciated by those skilled in the art.

The electrical system 100 further includes at least one contactor 116, 118, 120 for opening (i.e., preventing current flow) and or closing (i.e., enabling current flow) between the HV power supply 104 and the load 111. Specifically, in the exemplary embodiment, a positive contactor 116 is electrically connected between the positive pole 108 and the load 111 while a negative contactor 118 and a precharge contactor 120 are electrically connected between the negative pole 110 and the load 111. Each contactor 116, 118, 120 includes a first contact (not numbered), a second contact (not numbered), and a coil (not shown). When energized, the coil, i.e., an electromagnet, actuates the contacts together or apart to close or open the circuit, as is appreciated by those skilled in the art.

The electrical system 100 may also include a plurality of current sensors 122, 124. In the exemplary embodiment, a positive contactor current sensor 122 is configured to sense current flowing through the positive contactor 116 prior to its opening and/or after its closing. Likewise, in the exemplary embodiment, a negative contactor current sensor 124 is configured to sense current flowing through the negative contactor 118 prior to opening and/or after closing. Each current sensor 122, 124 may be integrated, i.e., packaged together, with the respective contactor 116, 118.

The electrical system 100 may further include at least one controller 126. The at least one controller 126 is in communication with at least one of the contactors 116, 118, 120. As such, the at least one controller 126 may control operation of the at least one contactor 116, 118, 120 and/or transmit data to and/or from the at least one contactor 116, 118, 120. The at least one controller 126 is also in communication with the current sensors 122, 124. As such, the at least one controller 126 may transmit data to and/or from the current sensors 122, 124.

In the exemplary embodiment shown in FIG. 1, the at least one controller 126 is implemented as a battery control module 128. The battery control module 128 includes a processor 130, e.g., a microprocessor, microcontroller, application specific integrated circuit, etc. capable of executing instructions (i.e., running a program) and/or performing calculations. The battery control module 128 may also include a memory 132 in communication with the processor 130. Of course, the processor 130 and the memory 132 may be part of a single integrated circuit or separate components.

In the exemplary embodiment, each contactor 116, 118, 120 includes an electronic memory 134 integrated therein. The electronic memory 134 is capable of storing data as is readily appreciated by those skilled in the art. Each contactor 116, 118, 120 may further include a processor 136 integrated therein. The processor 136 is in communication with the electronic memory 134 and is capable of executing instructions, performing calculations, etc. as is also appreciated by those skilled in the art. Of course, the electronic memory 134 and processor 136 may be integrated together on a single integrated circuit (not shown) or be implemented as separate components. Furthermore, the processors 136 integrated with the contactors 116, 118, 120 may function as the at least one controller 126 as described herein.

Figure 2:
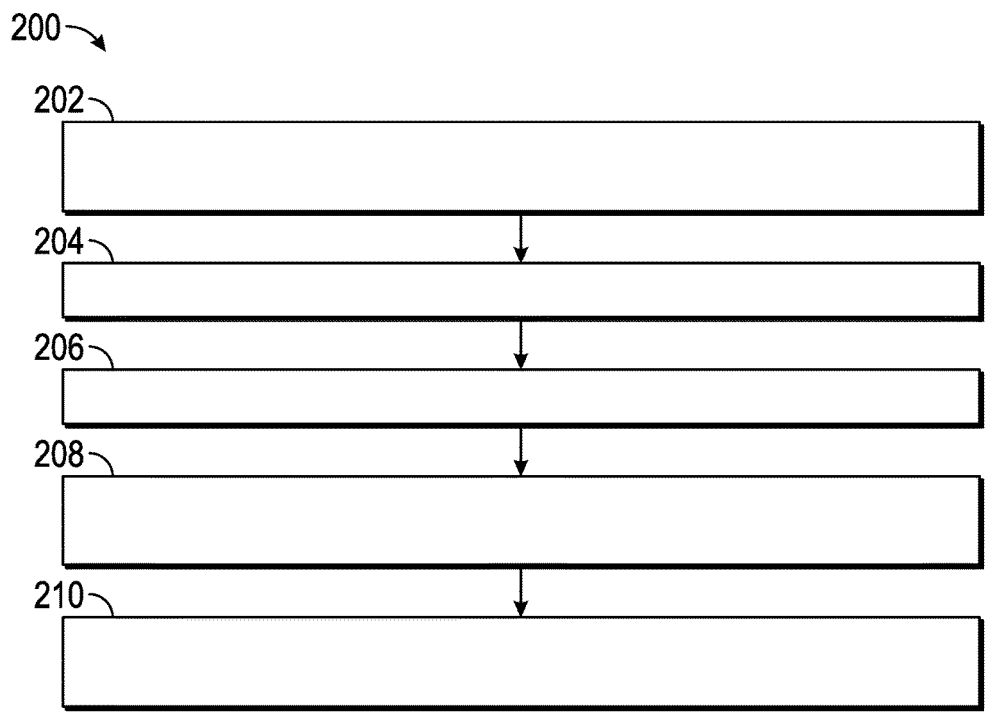
FIG. 2 is a flowchart illustrating a method of controlling a positive contactor and a negative contactor according to one exemplary embodiment.

FIG. 2 illustrates a method 200 of controlling the positive contactor 116 and the negative contactor 118. The method includes, at 202, sensing current flowing through each contactor 116, 118 prior to opening of the contactor 116, 118 and/or after closing of the contactor 116, 118. Sensing current may be achieved utilizing the current sensors 122, 124 of the exemplary system 100 described above. The sensed current may be stored in the at least one controller 126 and/or any other suitable device. For example, the sensed current may be stored in the electronic memories 134 of the positive and negative contactors 116, 118 and/or the electronic memory 132 of the battery control module 128.

The method 200 further includes, at 204, calculating a negative contactor weighted value. The negative contactor weighted value is based at least partially on the sensed current flowing through the negative contactor 118 during at least one opening and/or closing of the negative contactor 118.

Calculating the negative contactor weighted value may be achieved in part by incrementing a negative contactor counter in at least one of the electronic memories 132, 134 under certain conditions. Specifically, the counter is incremented in response to the current flowing through the negative contactor 118 being greater than a predetermined threshold prior to opening or after closing. That is, if the current flowing through the negative contactor 118 is too high (i.e., greater than the predetermined threshold) prior to a make or a break of the contactor 118, then the counter is incremented.

Computing the negative contactor weighted value may also include at least one negative contactor weighting factor. This weighting factor may vary based on the amount of current passing through the negative contactor 118 during opening and/or closing. In one embodiment, the negative contactor weighting factor is then multiplied to the negative contactor counter to generate the negative contactor weighted value.

A plurality of negative contactor open counters and negative contactor weighting factors may be utilized to generate the negative contactor weighted value. In one exemplary embodiment, computing the negative contactor weighted value may include a first negative contactor open counter, a first negative contactor close counter, a second negative contactor open counter, a second negative contactor close counter, a first threshold, and a second threshold. More specifically, the first negative contactor open counter is incremented in the electronic memory 134 in response to the current flowing through the negative contactor 118 prior to the opening of the negative contactor 118 being greater than the first threshold. In this particular example, the first threshold may be 20 amperes (A). However, it should be appreciated that other values may be contemplated by those skilled in the art. The first negative contactor close counter is incremented in response to the current flowing through the negative contactor 118 after the closing of the negative contactor being greater than the first threshold. The second negative contactor open counter is incremented in response to the current flowing through the negative contactor 118, before opening, being greater than the second threshold. The second threshold is greater than the first threshold. The second negative contactor close counter is incremented in response to the current flowing through the negative contactor 118, after closing, being greater than the second threshold.

In this exemplary embodiment, computing the negative contactor weighted value is achieved by multiplying each of the plurality of counters by a weighted factor, and then summing the results. Specifically, in this embodiment, computing the negative contactor weighted value is achieved by applying the following formula:

$$NCWV=(NCOC1*NCOWF1)+(NCOC2*NCOWF2)+(NCCC1*NCCWF1)+(NCCC2*NCCWF2)$$

wherein NCWV is the negative contactor weighted value, NCOC1 is the first negative contactor open counter, NCOWF1 is the first negative contactor open weighted factor, NCOC2 is the second negative contactor open counter, NCOWF2 is the second negative contactor open weighted factor, NCCC1 is the first negative contactor close counter, NCCWF1 is the first negative contactor close weighted factor, NCCC2 is the second negative contactor close counter, and NCCWF2 is the second negative contactor close weighted factor. The weighted factors are distinguished from one another by the associated severity of the amount of current flowing through the contactor 116, 118, 120 when opening occurs.

The method 200 further includes, at 206, calculating a positive contactor weighted value. The positive contactor weighted value is based at least partially on the sensed current flowing through the positive contactor 116 during at least one opening and/or closing of the positive contactor 116.

Calculating the positive contactor weighted value may be achieved in part by incrementing a positive contactor counter in at least one of the electronic memories 132, 134 under certain conditions. Specifically, the counter is incremented in response to the current flowing through the positive contactor 116 being greater than a predetermined threshold prior to opening or after closing. That is, if the current flowing through the positive contactor 116 is too high (i.e., greater than the predetermined threshold) prior to a make or a break of the contactor 116, then the counter is incremented.

Computing the positive contactor weighted value may also include at least one positive contactor weighting factor. This weighting factor may vary based on the amount of current passing through the positive contactor 116 during opening and/or closing. In one embodiment, the positive contactor weighting factor is then multiplied to the positive contactor counter to generate the positive contactor weighted value.

A plurality of positive contactor open counters and positive contactor weighting factors may be utilized to generate the positive contactor weighted value. In one exemplary embodiment, computing the positive contactor weighted value may include a first positive contactor open counter, a first positive contactor close counter, a second positive contactor open counter, a second positive contactor close counter, a first threshold, and a second threshold. More specifically, the first positive contactor open counter is incremented in the electronic memory 134 in response to the current flowing through the positive contactor 116 prior to the opening of the positive contactor 116 being greater than the first threshold. In this particular example, the first threshold may be 20 A. However, it should be appreciated that other values may be contemplated by those skilled in the art. The first positive contactor close counter is incremented in response to the current flowing through the positive contactor 116 after the closing of the positive contactor being greater than the first threshold. The second positive contactor open counter is incremented in response to the current flowing through the positive contactor 116, before opening, being greater than the second threshold. The second threshold is greater than the first threshold. The second positive contactor close counter is incremented in response to the current flowing through the positive contactor 116, after closing, being greater than the second threshold.

In this exemplary embodiment, computing the positive contactor weighted value is achieved by multiplying each of the plurality of counters by a weighted factor, and then summing the results. Specifically, in this embodiment, computing the positive contactor weighted value is achieved by applying the following formula:

$$PCWV=(PCOC1*PCOWF1)+(PCOC2*PCOWF2)+(PCCC1*PCCWF1)+(PCCC2*PCCWF2)$$

wherein PCWV is the positive contactor weighted value, PCOC1 is the first positive contactor open counter, PCOWF1 is the first positive contactor open weighted factor, PCOC2 is the second positive contactor open counter, PCOWF2 is the second positive contactor open weighted factor, PCCC1 is the first positive contactor close counter, PCCWF1 is the first positive contactor close weighted factor, PCCC2 is the second positive contactor close counter, and PCCWF2 is the second positive contactor close weighted factor. The weighted factors are distinguished from one another by the associated severity of the amount of current flowing through the contactor 116, 118, 120 when closing occurs.

The method 200 further includes, at 208, determining the order of opening and/or closing of the negative contactor 118 and the positive contactor 116. This determination may utilize the negative contactor weighted value and/or the positive contactor weighted value. The electrical system 100 may have a default order for opening and/or closing the contactors 116, 118, 120. In one exemplary embodiment, the default order of closing the contactors 116, 118, 120 is to first close the positive contactor 116, then to close the pre-charge contractor 120, followed by the closing of the negative contactor 118. The default order of opening the contactors 116, 118, in one exemplary embodiment, is first opening the negative contactor 118, then opening the positive contactor 116. It should be noted that the pre-charge contactor 120 is typically open during the sequence of opening the other contactors 116, 118. It should also be noted that other default orders for opening and/or closing the contactors 116, 118, 120 may be implemented.

Figure 3:
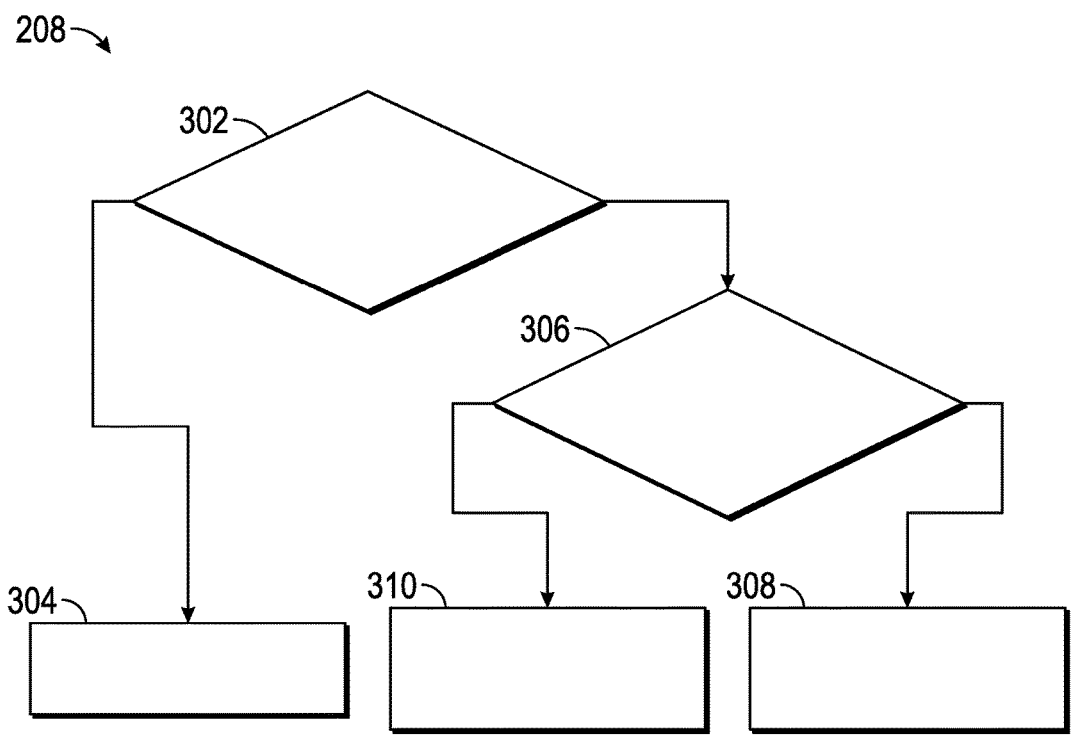
FIG. 3 is a flowchart illustrating a technique for determining the order of opening and/or closing the contactors according to one exemplary embodiment.

Determining the order of opening and/or closing the contactors 116, 118 may include comparing at least one of the negative contactor weighted value and the positive contactor weighted value to a weighted threshold value. The weighted threshold value is an amount related to a minimum value needed to change the order of opening and/or closing of the contactors 116, 118 from the default order. As such, in one exemplary embodiment, as shown at 302 in FIG. 3, the negative contactor weighted value is compared to the weighted threshold value. If the negative contactor weighted value is less than the weighted threshold value, then the contactors 116, 118, 120 are set to operate according to the default order, as shown at 304.

If the negative contactor weighted value is not less than the weighted threshold value, then determining the order of opening and/or closing the contactors 116, 118 may include comparing the negative contactor weighted value to the positive contactor weighted value, as shown in 306. In the exemplary embodiment, if the negative contactor weighted value is greater than the positive contactor weighted value, then the positive contactor is set to open prior to the negative contactor in response to the open command being received, as shown in 308. If the negative contactor weighted value is not greater than the positive contactor weighted value, then the negative contactor is set to open prior to the positive contactor in response to the open command being received, as shown in 310.

Referring once again to FIG. 2, the method 200 further includes, at 210, operating the contactors 116, 118, 120 based on the determined order and in response to receiving an open command and/or a close command.

The first contactor to open and/or close, i.e., the contactor 116, 118, 120 to make or break the circuit, is typically more susceptible to the adverse effects of arcing. By changing the order of the opening and/or closing of the contactors 116, 118, 120, the less adversely effected contactor 116, 118, 120 is subjected to potential adverse effects, thus balancing any adverse effects on the contactors 116, 118, 120. As such, the overall useful life and serviceability of the electrical system 100 is improved.

The system 100 may further include a user interface 138 in communication with the at least one controller 126. The user interface 138 may include a display (not shown), speaker (not shown), warning light (not shown), or other type of annunciator as well appreciated by those skilled in the art. The user interface 138 may be utilized to issue a warning signal to a user, e.g., a driver, of the vehicle 102. This warning signal may be issued, for example, when the order of the contactors 116, 118, 120 being opened and/or closed is changed. In another example, the warning signal may be issued when the positive contactor weighted value and/or negative contactor weighted value reach a predetermined level.

The detailed description and the drawings or figures are supportive and descriptive of the disclosure, but the scope of the disclosure is defined solely by the claims. While some of the best modes and other embodiments for carrying out the claimed teachings have been described in detail, various alternative designs and embodiments exist for practicing the disclosure defined in the appended claims.

The invention claimed is:

1. A method of controlling a positive contactor and a negative contactor in a high voltage electrical system, the method comprising:
    sensing current flowing through each contactor prior to opening of the contactor and/or after closing of the contactor;
    calculating a negative contactor weighted value based at least partially on the sensed current flowing through the negative contactor during at least one opening and/or closing of the negative contactor;
    calculating a positive contactor weighted value based at least partially on the sensed current flowing through the positive contactor during at least one opening and/or closing of the positive contactor;
    determining the order of opening and/or closing of the negative contactor and the positive contactor utilizing at least one of the negative contactor weighted value and the positive contactor weighted value; and
    operating the contactors based on the determined order and in response to receiving an open command or a close command.

2. The method as set forth in claim 1 wherein calculating a negative contactor weighted value comprises:
    incrementing a negative contactor counter in an electronic memory in response to the current flowing through the negative contactor prior to the opening of the negative contactor or after the closing of the negative contactor being greater than a first threshold;
    computing the negative contactor weighted value based on the negative contactor counter and at least one negative contactor weighting factor.

3. The method as set forth in claim 2 wherein calculating a positive contactor weighted value comprises:
    incrementing a positive contactor counter in an electronic memory in response to the current flowing through the positive contactor prior to the opening of the positive contactor or after the closing of the positive contactor being greater than a first threshold;
    computing the positive contactor weighted value based on the positive contactor counter and at least one positive contactor weighting factor.

4. The method as set forth in claim 3 wherein incrementing a negative contactor counter comprises:
    incrementing a first negative contactor open counter in the electronic memory in response to the current flowing through the negative contactor prior to the opening of the negative contactor being greater than the first threshold;
    incrementing a first negative contactor close counter in the electronic memory in response to the current flowing through the negative contactor after the closing of the negative contactor being greater than the first threshold;
    incrementing a second negative contactor open counter in the electronic memory in response to the current flowing through the negative contactor before the opening of the negative contactor being greater than a second threshold greater than the first threshold; and
    incrementing a second negative contactor close counter in the electronic memory in response to the current flowing through the negative contactor after the closing of the negative contactor being greater than the second threshold; and wherein incrementing a positive contactor counter comprises:
incrementing a first positive contactor open counter in the electronic memory in response to the current flowing through the positive contactor prior to the opening of the positive contactor being greater than the first threshold;
incrementing a first positive contactor close counter in the electronic memory in response to the current flowing through the positive contactor after the closing of the positive contactor being greater than the first threshold;
incrementing a second positive contactor open counter in the electronic memory in response to the current flowing through the positive contactor before the opening of the positive contactor being greater than a second threshold greater than the first threshold; and
incrementing a second positive contactor close counter in the electronic memory in response to the current flowing through the positive contactor after the closing of the positive contactor being greater than the second threshold.

5. The method as set forth in claim 4 wherein computing the negative contactor weighted value comprises using the following formula:

$$NCWV=(NCOC1*NCOWF1)+(NCOC2*NCOWF2)+(NCCC1*NCCWF1)+(NCCC2*NCCWF2)$$

wherein NCWV is the negative contactor weighted value, NCOC1 is the first negative contactor open counter, NCOWF1 is the first negative contactor open weighted factor, NCOC2 is the second negative contactor open counter, NCOWF2 is the second negative contactor open weighted factor, NCCC1 is the first negative contactor close counter, NCCWF1 is the first negative contactor close weighted factor, NCCC2 is the second negative contactor close counter, and NCCWF2 is the second negative contactor close weighted factor.

6. The method as set forth in claim 5 wherein computing the negative contactor weighted value comprises using the following formula:

$$PCWV=(PCOC1*PCOWF1)+(PCOC2*PCOWF2)+(PCCC1*PCCWF1)+(PCCC2*PCCWF2)$$

wherein PCWV is the positive contactor weighted value, PCOC1 is the first positive contactor open counter, PCOWF1 is the first positive contactor open weighted factor, PCOC2 is the second positive contactor open counter, PCOWF2 is the second positive contactor open weighted factor, PCCC1 is the first positive contactor close counter, PCCWF1 is the first positive contactor close weighted factor, PCCC2 is the second positive contactor close counter, and PCCWF2 is the second positive contactor close weighted factor.

7. The method as set forth in claim 6 further comprising comparing at least one of the negative contactor weighted value and the positive contactor weighted value to a weighted threshold value.

8. The method as set forth in claim 7 wherein the determined order is a default order in response to the at least one of the negative contactor weighted value and the positive contactor weighted value being less than or equal to the weighted threshold value and wherein operating the contactors is further defined as operating the contactors based on the default order in response to receiving an open command or a close command.

9. The method as set forth in claim 7 further comprising comparing the negative contactor weighted value to the positive contactor weighted value.

10. The method as set forth in claim 9 wherein operating the contactors comprises opening the negative contactor prior to the positive contactor in response to the positive contactor weighted value being greater than the negative contactor weighted value and the open command being received.

11. The method as set forth in claim 9 wherein operating the contactors comprises opening the positive contactor prior to the negative contactor in response to the negative contactor weighted value being greater than the positive contactor weighted value and the open command being received.

12. An electrical system comprising:
a high voltage ("HV") power supply having a positive pole and a negative pole;
a positive contactor electrically connected between the positive pole and a load;
a negative contactor electrically connected between the negative pole and the load;
a positive contactor current sensor configured to sense current flowing through the positive contactor prior to opening and/or after closing of the positive contactor;
a negative contactor current sensor configured to sense current flowing through the negative contactor prior to opening and/or after closing of the negative contactor; and
at least one controller in communication with the contactors and the current sensors and configured to:
calculate a negative contactor weighted value based at least partially on the sensed current flowing through the negative contactor during at least one opening and/or closing of the negative contactor;
calculate a positive contactor weighted value based at least partially on the sensed current flowing through the positive contactor during at least one opening and/or closing of the positive contactor;
determine the order of opening and/or closing of the negative contactor and the positive contactor utilizing at least one of the negative contactor weighted value and the positive contactor weighted value; and
operate the contactors based on the determined order and in response to receiving an open command or a close command.

13. The system as set forth in claim 12 wherein the negative contactor includes an electronic memory for storing a negative contactor counter which is incremented in response to the current flowing through the negative contactor prior to the opening of the negative contactor or after the closing of the negative contactor being greater than a first threshold.

14. The system as set forth in claim 13 wherein the at least one controller is configured to compute the negative contactor weighted value based on the negative contactor counter and at least one negative contactor weighting factor.

15. The system as set forth in claim 14 wherein the positive contactor includes an electronic memory for storing a positive contactor counter which is incremented in response to the current flowing through the positive contactor prior to the opening of the positive contactor or after the closing of the positive contactor being greater than a first threshold.

16. The system as set forth in claim 15 wherein the at least one controller is configured to compute the positive contactor weighted value based on the positive contactor counter and at least one positive contactor weighting factor.

17. The system as set forth in claim 12 further comprising a user interface in communication with the at least one controller.

18. A vehicle having a high voltage ("HV") electrical system, the vehicle comprising:
- an HV power supply having a positive pole and a negative pole;
- an electric motor electrically connectable to the HV power supply;
- a positive contactor electrically connected between the positive pole and the electric motor;
- a negative contactor electrically connected between the negative pole and the electric motor;
- a positive contactor current sensor configured to sense current flowing through the positive contactor prior to opening and/or after closing of the positive contactor;
- a negative contactor current sensor configured to sense current flowing through the negative contactor prior to opening and/or after closing of the negative contactor; and
- at least one controller in communication with the contactors and the current sensors and configured to:
  - calculate a negative contactor weighted value based at least partially on the sensed current flowing through the negative contactor during at least one opening and/or closing of the negative contactor;
  - calculate a positive contactor weighted value based at least partially on the sensed current flowing through the positive contactor during at least one opening and/or closing of the positive contactor;
  - determine the order of opening and/or closing of the negative contactor and the positive contactor utilizing at least one of the negative contactor weighted value and the positive contactor weighted value; and
  - operate the contactors based on the determined order and in response to receiving an open command or a close command.

* * * * *